United States Patent
Tsai et al.

(10) Patent No.: US 9,978,821 B2
(45) Date of Patent: May 22, 2018

(54) DISPLAY DEVICE

(71) Applicant: Industrial Technology Research Institute, Hsinchu (TW)

(72) Inventors: Yi-Shou Tsai, Taipei (TW); Kuo-Chang Lee, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days. days.

(21) Appl. No.: 15/393,277

(22) Filed: Dec. 29, 2016

(65) Prior Publication Data
US 2017/0271420 A1 Sep. 21, 2017

Related U.S. Application Data

(60) Provisional application No. 62/360,932, filed on Jul. 11, 2016, provisional application No. 62/309,971, filed on Mar. 18, 2016.

(51) Int. Cl.
*H01L 29/207* (2006.01)
*H01L 27/32* (2006.01)
*H01L 51/52* (2006.01)

(52) U.S. Cl.
CPC .......... *H01L 27/3258* (2013.01); *H01L 27/32* (2013.01); *H01L 27/323* (2013.01);
(Continued)

(58) Field of Classification Search
CPC ... H01L 27/32; H01L 27/323; H01L 27/3246; H01L 51/5284; H01L 51/5281; H01L 51/5256
See application file for complete search history.

(56) References Cited

U.S. PATENT DOCUMENTS

| 6,515,428 B1 | 2/2003 | Yeh et al. |
| 7,626,329 B2 | 12/2009 | Ryu et al. |

(Continued)

FOREIGN PATENT DOCUMENTS

| CN | 1591055 | 3/2005 |
| CN | 101162678 | 4/2008 |

(Continued)

OTHER PUBLICATIONS

"Notice of allowance of Taiwan Counterpart Application", dated Aug. 9, 2017, p. 1-p. 4, in which the listed references were cited.
(Continued)

*Primary Examiner* — A. Sefer
(74) *Attorney, Agent, or Firm* — JCIPRNET (57) ABSTRACT

According to an embodiment of the present disclosure, a display device including a first substrate, a display element layer, a second substrate opposite to the first substrate, a gray film disposed on the second substrate, and a light absorbing layer disposed on the second substrate is provided. The display element layer disposed on the first substrate includes at least one pixel structure including a light-emitting layer and having a light-emitting region. An orthogonal projection area of the gray film on the second substrate overlaps an orthogonal projection area of the opening of the light absorbing layer on the second substrate. An area of the pixel structure is P, an area of the light-emitting region is W. An area of the opening is AR. W<AR≤0.5P. An orthogonal projection area of the light-emitting region on the second substrate is located in an orthogonal projection area of the opening on the second substrate.

20 Claims, 5 Drawing Sheets

(52) U.S. Cl.
CPC ...... *H01L 27/3246* (2013.01); *H01L 51/5256* (2013.01); *H01L 51/5281* (2013.01); *H01L 51/5284* (2013.01)

(56) References Cited

U.S. PATENT DOCUMENTS

| | | | |
|---|---|---|---|
| 7,923,923 B2 | 4/2011 | Cho et al. | |
| 8,866,170 B2 | 10/2014 | Moon et al. | |
| 2003/0184705 A1 | 10/2003 | Murade et al. | |
| 2004/0075384 A1* | 4/2004 | Aoki | B82Y 10/00 313/506 |
| 2008/0185958 A1* | 8/2008 | Yoon | H01J 29/327 313/504 |
| 2012/0086669 A1 | 4/2012 | Kim et al. | |
| 2013/0113732 A1 | 5/2013 | Kang et al. | |
| 2013/0135224 A1 | 5/2013 | Lee et al. | |
| 2014/0022208 A1 | 1/2014 | Wu | |
| 2014/0027798 A1* | 1/2014 | Sato | H01L 33/50 257/89 |
| 2015/0001474 A1* | 1/2015 | Park | H01L 51/5271 257/40 |
| 2015/0253899 A1 | 9/2015 | Yang et al. | |
| 2015/0311477 A1 | 10/2015 | Cho et al. | |
| 2016/0079567 A1* | 3/2016 | Cho | H01L 51/5284 257/40 |
| 2016/0104869 A1* | 4/2016 | Choi | H01L 51/5281 257/40 |

FOREIGN PATENT DOCUMENTS

| | | |
|---|---|---|
| CN | 102645753 | 8/2012 |
| CN | 103135827 | 6/2013 |
| CN | 103632755 | 3/2014 |
| CN | 103681737 | 3/2014 |
| CN | 104267518 | 1/2015 |
| CN | 104752484 | 7/2015 |
| EP | 2784637 | 10/2014 |
| TW | 200730892 | 8/2007 |
| TW | 201403193 | 1/2014 |
| TW | I470495 | 1/2015 |
| TW | I471605 | 2/2015 |
| TW | M498950 | 4/2015 |
| TW | 201525801 | 7/2015 |
| WO | 2013181899 | 12/2013 |

OTHER PUBLICATIONS

"Office Action of Taiwan Related Application, application No. 105126954", dated Oct. 31, 2017, p. 1-p. 11, in which the listed references were cited.

* cited by examiner

DISPLAY DEVICE

CROSS-REFERENCE TO RELATED APPLICATION

This application claims the priority benefits of U.S. provisional application Ser. No. 62/360,932, filed on Jul. 11, 2016, and U.S. provisional application Ser. No. 62/309,971, filed on Mar. 18, 2016. The entirety of each of the above-mentioned patent applications is hereby incorporated by reference herein.

TECHNICAL FIELD

The present disclosure generally relates to a display device.

BACKGROUND

Regarding a display device, a contrast ratio thereof is one of the factors determining the display quality. Strong ambient light would cause a low ambient contrast ratio of the display device relative to the ambient brightness so as to influence on the display quality of the display device. Taken an organic light-emitting diode display device as an example, a light absorbing layer may be additionally disposed onto the opposite substrate for absorbing the ambient light. An orthogonal projection area of the light absorbing layer on the substrate which the light-emitting layer is forming on would partially overlap the light-emitting layer. A portion of light emitted from the light-emitting layer will be blocked by the light absorbing layer so as to influence on the light-emitting angle of the light-emitting layer. The light-emitting angle of the light-emitting layer could not be maintained while the reflection of the ambient light is controlled. In addition, a portion of the light emitted from the light-emitting layer will be absorbed by the light absorbing layer, the emitting brightness of the light-emitting layer is insufficient, which influences on the ambient contrast ratio of the display device relative to the ambient brightness.

SUMMARY

A display device according to an embodiment of the disclosure may include a first substrate, a display element layer, a second substrate, a gray film and a light absorbing layer. The display element layer is disposed on the first substrate and includes at least one pixel structure, wherein the pixel structure includes a light-emitting layer and has a light-emitting region. The second substrate is disposed opposite to the first substrate. The gray film is disposed on the second substrate. The light absorbing layer is disposed on the second substrate and has at least one opening, wherein an orthogonal projection area of the gray film on the second substrate overlaps an orthogonal projection area of the opening on the second substrate. An area of the pixel structure is P, an area of the light-emitting region is W, an area of the opening is AR, and $W<AR \leq 0.5P$. An orthogonal projection area of the light-emitting region on the second substrate is located in the orthogonal projection area of the opening on the second substrate.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts.

Figure 1A:
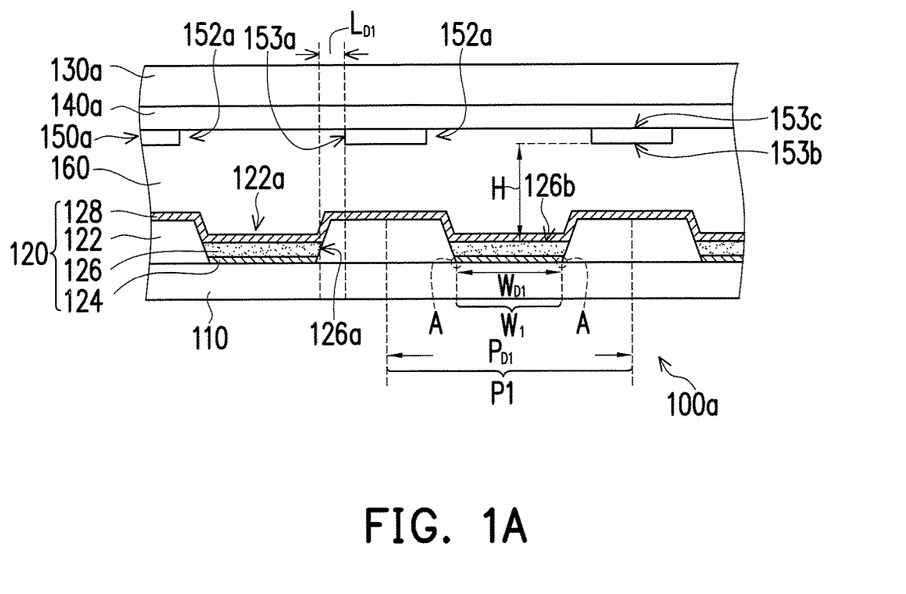
FIG. 1A is a schematic cross-sectional view of a display device according to an embodiment of the disclosure.
Figure 1B:
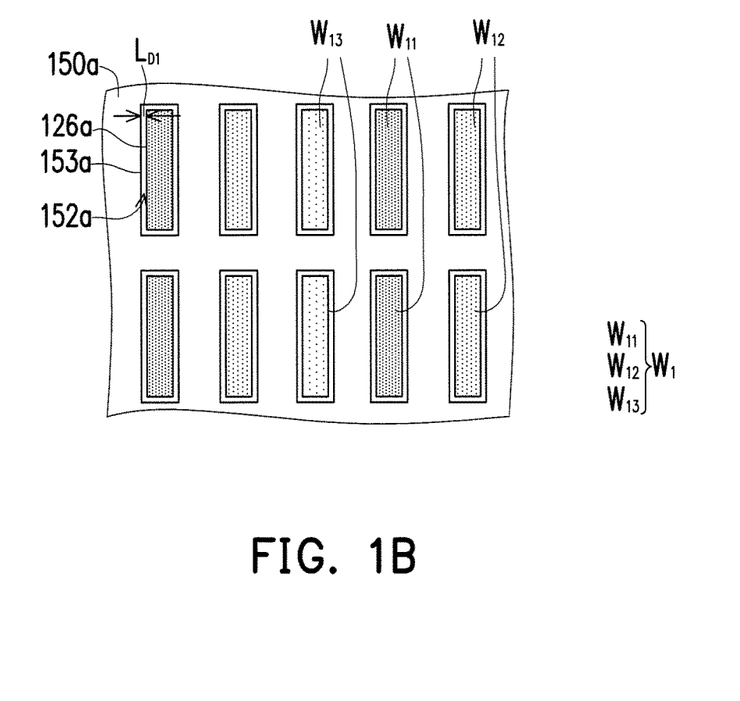
FIG. 1B is a schematic top view showing the plurality of light-emitting regions in FIG. 1A.

FIG. 1A is a schematic cross-sectional view of a display device according to an embodiment of the disclosure. FIG. 1B is a schematic top view showing the plurality of light-emitting regions in FIG. 1A. Referring to FIG. 1A, a display device 100a according to the embodiment includes a first substrate 110, a display element layer 120, a second substrate 130a, a gray film 140a and a light absorbing layer 150a. The display element layer 120 is disposed on the first substrate 110, and includes at least one pixel structure P1, wherein the pixel structure P1 includes a light-emitting layer 126 and has a light-emitting region W. The second substrate 130a is disposed opposite to the first substrate 110. The gray film 140a is disposed on the second substrate 130a. The light absorbing layer 150a is disposed on the second substrate 130a and has at least one opening 152a, wherein an orthogonal projection area of the gray film 140a overlaps an orthogonal projection area of the opening 152a. In FIG. 1A, the quantity of the opening 152a is a plural, which is taken as an example. An area of the pixel structure P1 is P, an area of the light-emitting region $W_1$ is W, an area of the opening 152a is AR, and $W<AR \leq 0.5P$. An orthogonal projection area of the light-emitting region $W_1$ on the second substrate 130a is located in an orthogonal projection area of the opening 152a on the second substrate 130a.

The first substrate 110 in the embodiment may be a flexible substrate, and a material of the first substrate 110 may include thin glass, metal foil, polymer material such as polyimide (PI), hybrid PI, polyethylene terephthalate (PET), polyethersulfone (PES), polyacrylate (PA), polyethylene naphthalate (PEN), polycarbonate (PC), polynorbornene (PNB), polyetherimide (PEI), polyetheretherketone (PEEK), cyclo olefin polymer (COP), PMMA, Glass Fiber Reinforced Plastic (GFRP), Carbon Fiber Reinforced Polymer (CFRP), etc., or other suitable soft/flexible materials. Certainly, in other embodiments, the first substrate 110 may be made of glass or other rigid material and serve as a rigid substrate. Alternately, the first substrate 110 may be a composite substrate made of multiple organic layers and/or inorganic layers having water gas barrier property so as to involve the water gas barrier function. Herein, the type and the composition of the first substrate 110 are not specifically restricted.

The display element layer 120 in the embodiment further includes a pixel defining layer 122, a first electrode 124 and a second electrode 128. The pixel defining layer 122 has a pixel disposing opening 122a. The first electrode 124, the light-emitting layer 126 and the second electrode 128 are sequentially stacked over the first substrate 110 in the pixel disposing opening 122a, and the second electrode 128 may extend to cover over the pixel defining layer 122. As shown in FIG. 1A, the outline of the pixel disposing opening 122a adjacent to the first substrate 110, such as the region A, surrounds and defines the light-emitting region $W_1$. A transversal area of the pixel disposing opening 122a is gradually increased from the first substrate 110 toward the second substrate 130a, which means that the cross section of the pixel disposing opening 122a as shown in FIG. 1A may be a reversed trapezoid. A width of the light absorbing layer 150a is smaller than a width of the pixel defining layer 122, which means that the light absorbing layer 150a is shrunk relative to the pixel defining layer 122 by a width.

Furthermore, the material of the pixel defining layer 122 may be an insulation material and the cross sectional outline of the pixel disposing opening 122a may be a rectangle, a trapezoid, etc. The first electrode 124 and the second electrode 128 may respective be an anode and a cathode, for providing a current to the light-emitting layer 126 to emit light. A material of the first electrode 124 and the second electrode 128 may be Indium Tin Oxide (ITO) or Indium Zinc Oxide (IZO), but the disclosure is not limited thereto. The material of the first electrode 124 and the second electrode 128 may be identical or different. The light-emitting layer 126 may be constructed by various organic light-emitting layers capable of being used in an organic light-emitting diode device, but the disclosure is not limited thereto. In the embodiment, the light-emitting region $W_1$ is served as the region where the light-emitting layer 126 exists.

Referring to FIG. 1B, there are a plurality of light-emitting regions $W_1$ in the present embodiment, and each of the light-emitting regions $W_1$ may have a rectangular shape in the top view. The light-emitting regions $W_1$ includes a plurality of red light-emitting regions $W_{11}$, a plurality of green light-emitting regions $W_{12}$, and a plurality of blue light-emitting regions $W_{13}$, wherein the red light-emitting regions $W_{11}$, the green light-emitting regions $W_{12}$, and the blue light-emitting regions $W_{13}$ are arranged in sequence, alternately, and spaced from one another by a constant pitch to form an array. Certainly, the shape in the top view, the color of the emitted light, and the arrangement of the light-emitting regions $W_1$ are not specifically restricted in the embodiment.

Figure 2A:
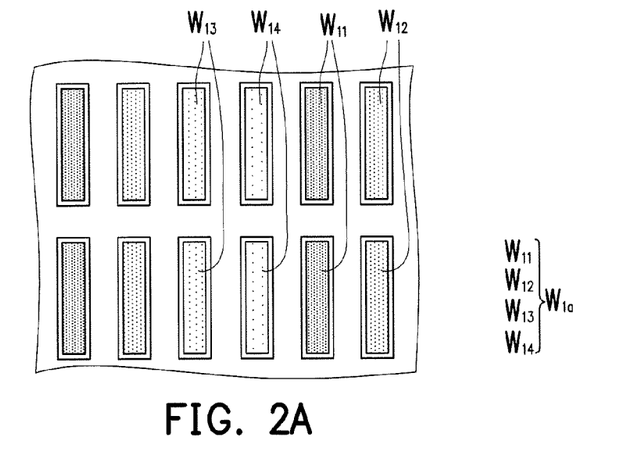
FIG. 2A to FIG. 2H are schematic top views showing the plurality of light-emitting regions in various embodiments.

For example, the top view shape of the light-emitting regions $W_{1a}$ is a rectangle, for example, and the light-emitting regions $W_{1a}$ also include a plurality of red light-emitting regions $W_{11}$, a plurality of green light-emitting regions $W_{12}$, a plurality of blue light-emitting regions $W_{13}$, and a plurality of white light-emitting regions $W_{14}$, wherein the red light-emitting regions $W_{11}$, the green light-emitting regions $W_{12}$, the blue light-emitting regions $W_{13}$, and the white light-emitting regions $W_{14}$ are arranged in sequence, alternately and spaced from one another by a constant pitch to form an array. In alternate embodiments not shown in the drawings, the red light-emitting regions, the green light-emitting regions, the blue light-emitting regions and the white light-emitting regions may be arranged without following a specific sequence and a constant pitch.

Figure 2B:
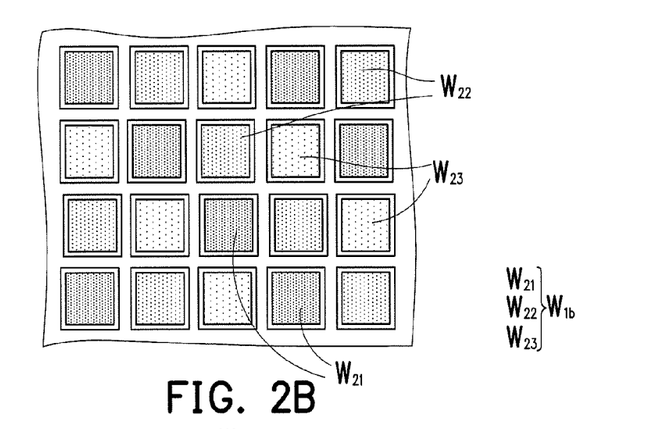

Alternately, the top view shape of each light-emitting region $W_{1b}$ is a square, for example, and the light-emitting regions $W_{1b}$ include a plurality of red light-emitting regions $W_{21}$, a plurality of green light-emitting regions $W_{22}$, and a plurality of blue light-emitting regions $W_{23}$, wherein the red light-emitting regions $W_{21}$, the green light-emitting regions $W_{22}$, and the blue light-emitting regions $W_{23}$ are arranged alternately and spaced from one another by a constant pitch to form an array. In addition, the light-emitting regions having the same color are not arranged next to each other, so as to have a mosaic arrangement.

Figure 2C:
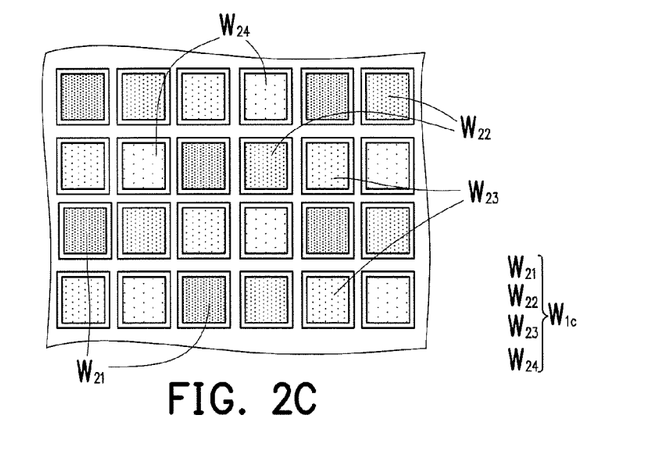

Alternately, referring to FIG. 2C, the top view shape of each light-emitting region $W_{1c}$ is a square, for example, and the light-emitting regions $W_{1c}$ include a plurality of red light-emitting regions $W_{21}$, a plurality of green light-emitting regions $W_{22}$, a plurality of blue light-emitting regions $W_{23}$, and a plurality of white light-emitting regions $W_{24}$, wherein the red light-emitting regions $W_{21}$, the green light-emitting regions $W_{22}$, the blue light-emitting regions $W_{23}$, and the white light-emitting regions $W_{24}$ are arranged alternately and spaced from one another by a constant pitch to form an array. In addition, the light-emitting regions having the same color are not arranged next to each other, so as to have a mosaic arrangement.

Figure 2D:
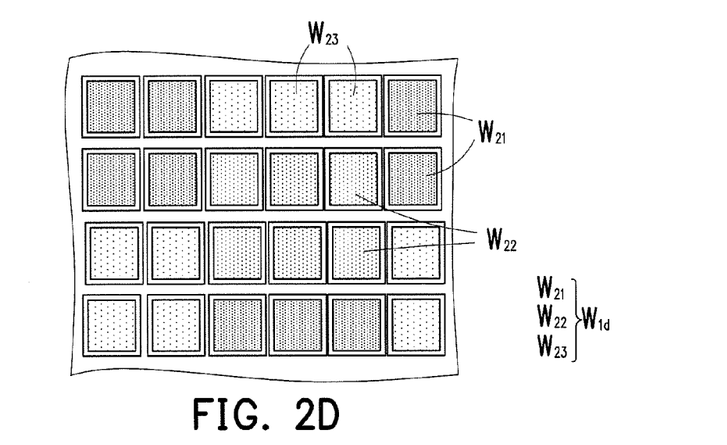

Alternately, referring to FIG. 2D, the top view shape of each light-emitting region $W_{1d}$ is a square, for example, and the light-emitting regions $W_{1d}$ include a plurality of red light-emitting regions $W_{21}$, a plurality of green light-emitting regions $W_{22}$, and a plurality of blue light-emitting regions $W_{23}$, wherein the red light-emitting regions $W_{21}$, the green light-emitting regions $W_{22}$, and the blue light-emitting regions $W_{23}$ are arranged alternately and spaced from one another by a constant pitch to form an array. In addition, two light-emitting regions having the same color are arranged next to each other.

Figure 2E:
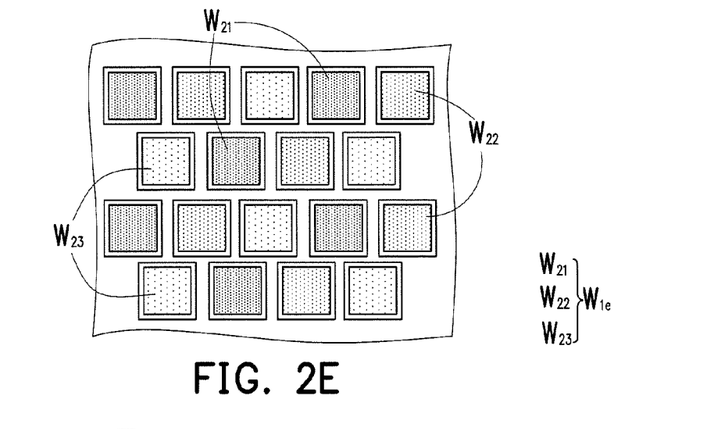

Alternately, referring to FIG. 2E, the top view shape of each light-emitting region $W_{1e}$ is a square, for example, and the light-emitting regions $W_1$, include a plurality of red light-emitting regions $W_{21}$, a plurality of green light-emitting regions $W_{22}$, and a plurality of blue light-emitting regions $W_{23}$, wherein the red light-emitting regions $W_{21}$, the green light-emitting regions $W_{22}$, and the blue light-emitting regions $W_{23}$ are arranged alternately and spaced from one another by a constant pitch to form an array. In addition, two adjacent rows of the light-emitting regions $W_{1e}$ are arranged in a staggered manner and the light-emitting regions having the same color are not arranged next to each other.

Figure 2F:
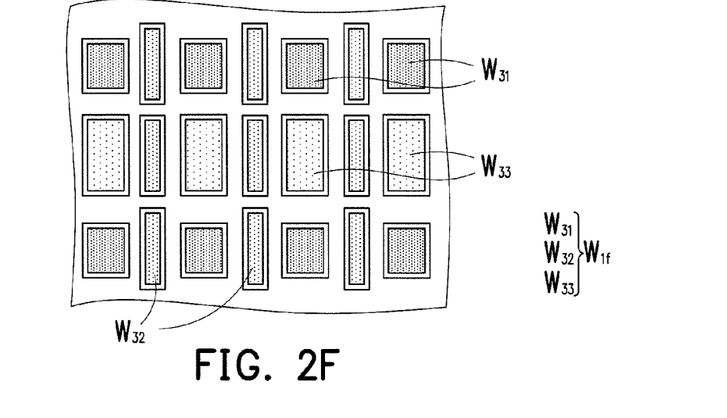

Alternately, referring to FIG. 2F, the top view shape of each light-emitting region $W_{1f}$ is a rectangle, for example, and the light-emitting regions $W_{1f}$ include a plurality of red light-emitting regions $W_{31}$, a plurality of green light-emitting regions $W_{32}$, and a plurality of blue light-emitting regions $W_{33}$. An area of respective red light-emitting regions $W_{31}$ is smaller than an area of respective blue light-emitting regions $W_{33}$, and the area of the respective red light-emitting regions $W_{31}$ is greater than an area of respective green light-emitting regions $W_{32}$, but the disclosure is not limited thereto. The red light-emitting regions $W_{31}$ and the green light-emitting regions $W_{32}$ are arranged alternately in a row in a constant pitch, the blue light-emitting regions $W_{33}$ and the green light-emitting regions $W_{32}$ are arranged alternately in a row in a constant pitch, and the red light-emitting regions $W_{31}$ and the blue light-emitting regions $W_{33}$ are arranged alternately in a column in a constant pitch. In alternate embodiments not shown in the drawings, the size relationship of the areas of the light-emitting regions having different colors is not limited. In addition, the arrangement of the light-emitting regions having various colors is not limited to a specific design and is able to be modified according to a design requirement.

Figure 2G:
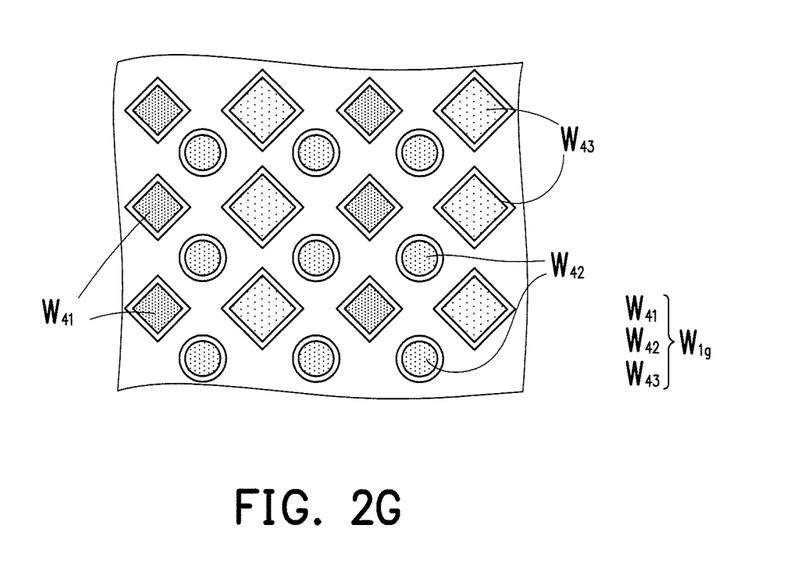

Alternately, referring to FIG. 2G, the top view shape of each light-emitting region $W_{1g}$ may be a diamond or a circle, for example, and the light-emitting regions $W_{1g}$ include a plurality of red light-emitting regions $W_{41}$ having diamond shapes, a plurality of green light-emitting regions $W_{42}$ having circle shapes, and a plurality of blue light-emitting regions $W_{43}$ having diamond shapes. An area of the red light-emitting region $W_{41}$ is smaller than an area of the blue light-emitting region $W_{43}$, but the area of the red light-emitting region $W_{41}$ is greater than an area of the green light-emitting region $W_{42}$. The red light-emitting regions $W_{41}$ and the blue light-emitting regions $W_{43}$ are arranged alternately in a constant pitch to form an array, the red light-emitting regions $W_{41}$ and the blue light-emitting regions $W_{43}$ in two adjacent rows are arranged in the same method, the green light-emitting regions $W_{42}$ are arranged in a constant pitch to form an array, and each green light-emitting region $W_{42}$ is surrounded by two red light-emitting regions $W_{41}$ and two blue light-emitting regions $W_{43}$.

Figure 2H:
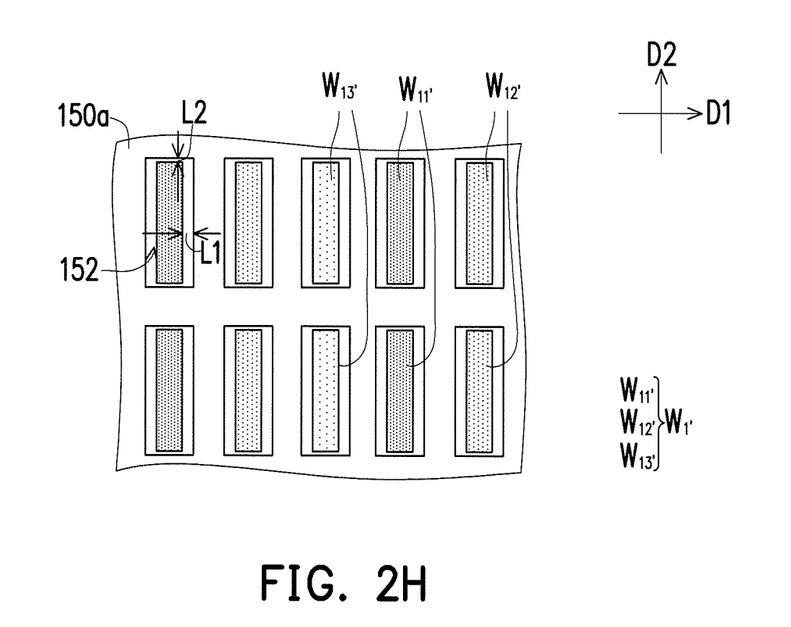

It is described that the light-emitting regions $W_1$ and $W_{1a}$ have the long and narrow type shape, in which the length edge and the width edge of respective light-emitting regions $W_1$ and $W_{1a}$ are spaced apart from the corresponding openings 152a by an identical distance. In other embodiments, referring to FIG. 2H, the light-emitting regions $W_{1'}$ include a plurality of red light-emitting regions $W_{11'}$, a plurality of green light-emitting regions $W_{12'}$ and a plurality of blue light-emitting regions $W_{13'}$, wherein the red light-emitting regions $W_{11'}$, the green light-emitting regions $W_{12'}$ and the blue light-emitting regions $W_{13'}$ are arranged alternately in sequence in an identical pitch to form an array. A first length difference L1 in a first direction D1 is formed between the area of the opening 152a and the area of the light-emitting region $W_{1'}$, a second length difference L2 in a second direction D2 is formed between the area of the opening 152a and the area of the light-emitting region $W_{1'}$, the first direction D1 is different from the second direction D2, and the first length difference L1 is difference from the second length difference L2. Namely, the shorter edge (the width edge) of the light-emitting region $W_{1'}$ may be shrunk with respect to the opening 152a in a greater extent to facilitate a larger viewing angle. In the embodiments not shown in the drawings, the above design may be adopted for enhancing the viewing angle in a specific direction, if needed.

Referring to FIG. 1A again, the gray film 140a and the light absorbing layer 150a according to the embodiment are located between the second substrate 130a and the first substrate 110a, wherein the gray film 140a may completely covers a surface of the second substrate 130a and the opening 152a of the light absorbing layer 150a exposes a portion of the gray film 140a. In one embodiment, a material of the gray film 140a may exemplary be a photoresist material mixed with dye, or a photoresist material added with carbon black. In an embodiment, the gray film 140a may have a transmittance rate of 20% to 70% for a wavelength of 550 nm, in which the transmittance rate of the gray film 140a may be adjusted while controlling the thickness thereof. For example, for enhancing the transmittance rate, the thickness of the gray film 140a may be reduced. On the contrary, for reducing the transmittance rate thereof, the thickness of the gray film 140a may be increased.

As shown in FIG. 1A, the orthogonal projection of the light absorbing layer 150a on the display element layer 120 does not overlap the light-emitting layer 126 in the present embodiment, and the light absorbing layer 150a is shrunk with respect to the light-emitting layer 126 by a distance. A horizontal distance between a first side edge 153a of the opening 152a of the light absorbing layer 150a and a second side edge 126a of the light-emitting region $W_1$ adjacent to the first side edge 153a is LD1, a vertical distance between a bottom surface 153b of the light absorbing layer 150a adjacent to the display element layer 120 and a top surface 126b of the light-emitting layer 126 in the light-emitting region $W_1$ is H, and $0<L_{D1} \leq 2\sqrt{H}$. The light absorbing layer 150a has a transmittance rate smaller than 10% for a wavelength of 550 nm, and a material of the light absorbing layer 150a may be black resin, so that the light absorbing layer 150a may be a black matrix. The ratio of the optical density of the light absorbing layer 150a and the gray film 140a for visible light may be 1 to 40 so that the reflection of the ambient light may be controlled to enhance the ambient contrast ratio of the display device 100a relative to the ambient brightness. The light absorbing layer 150a in the embodiment extends in an equal width manner from the bottom surface 153b adjacent to the display element layer 120 in a direction away from the display element layer 120. In other words, the shape of the openings 152a in the embodiment is specified as a rectangle as shown in FIG. 1B, but the disclosure is not limited thereto.

In addition, the display device 100a may further includes a medium layer 160 disposed between the display element layer 120 and the second substrate 130a for fixing the relative positions of the first substrate 110 and the second substrate 130a. In addition, the medium layer 160 may, for example, be an optical medium layer, an air layer, or a gel layer, which is not limited herein. In one embodiment, the reflectivity of the display device 100a with respect to the ambient light may be smaller than 12% so as to have a better ambient contrast ratio relative to the ambient brightness.

The following experimental examples illustrate that the display device 100a may maintain the light-emitting angle of the light-emitting regions $W_1$ while controlling the reflection of the ambient light. In a known display device without the configuration of the light absorbing layer, the light-emitting angle of the light-emitting layer is around ±33.3°. The so-called light-emitting angle means the angle at which the measured brightness is half of the brightness measured at the normal angle. For example, in the case that the brightness measured at the normal angle is 1000 nits and the brightness measured at 30 degrees is 500 nits, the light-emitting angle is considered as 30 degrees.

Experimental Example I: In the example, an area of the light-emitting region $W_1$ has 15.75 microns in width and 49.5 microns in length, a distance between two adjacent light-emitting regions $W_1$ in the same column is 32 microns, a distance between two adjacent light-emitting regions $W_1$ in the same row is 25 microns, and a vertical distance H between the bottom surface 153b of the light absorbing layer 150a adjacent to the display element layer 120 and the top surface 126b of the light-emitting layer 126 in the light-emitting region $W_1$ is 7 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±29.0°. In the present embodiment, the horizontal distance $L_{D1}$ between the first side edge 153a of the opening 152a of the light absorbing layer 150a and the second side edge 126a of the light-emitting region $W_1$ adjacent to the first side edge 153a is 3 microns, e.g. the light absorbing layer 150a is shrunk with respect to the light-emitting layer 126 by 3 microns, such that the light-emitting angle of the light-emitting layer 126 (or the pixel structure) is around ±32.4°. In brief, the design of the present embodiment helps to maintain the light-emitting angle of the light-emitting regions $W_1$ while controlling the reflection of the ambient light.

Experimental Example II: In the example, an area of the light-emitting region $W_1$ has 15.75 microns in width and 49.5 microns in length, a distance between two adjacent light-emitting regions $W_1$ in the same column is 32 microns, a distance between two adjacent light-emitting regions $W_1$ in the same row is 25 microns, and a vertical distance H between the bottom surface 153b of the light absorbing layer 150a adjacent to the display element layer 120 and the top surface 126b of the light-emitting layer 126 in the light-emitting region $W_1$ is 12 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±26.4°. In the present embodiment, the horizontal distance $L_{D1}$ between the first side edge 153a of the opening 152a of the light absorbing layer 150a and the second side edge 126a of the light-emitting region $W_1$ adjacent to the first side edge 153a is 5 microns, e.g. the light absorbing layer 150a is shrunk with respect to the light-emitting layer 126 by 5 microns, such that the light-emitting angle of the light-emitting layer 126 (or the pixel structure) is around ±32.3°. In brief, the design of the present embodiment helps to maintain the light-emitting angle of the light-emitting regions $W_1$ while controlling the reflection of the ambient light.

Experimental Example III: In the example, an area of the light-emitting region $W_1$ has 7.25 microns in width and 53.25 microns in length, a distance between two adjacent light-emitting regions $W_1$ in the same column is 26 microns, a distance between two adjacent light-emitting regions $W_1$ in the same row is 20 microns, and a vertical distance H between the bottom surface 153b of the light absorbing layer 150a adjacent to the display element layer 120 and the top surface 126b of the light-emitting layer 126 in the light-emitting region $W_1$ is 7 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±24.8°. In the present embodiment, the horizontal distance $L_{D1}$ between the first side edge 153a of the opening 152a of the light absorbing layer 150a and the second side edge 126a of the light-emitting region $W_1$ adjacent to the first side edge 153a is 4 microns, e.g. the light absorbing layer 150a is shrunk with respect to the light-emitting layer 126 by 4 microns, such that the light-emitting angle of the light-emitting layer 126 (or the pixel structure) is around ±32.4°. In brief, the design of the present embodiment helps to maintain the light-emitting angle of the light-emitting regions $W_1$ while controlling the reflection of the ambient light.

Experimental Example IV: In the example, an area of the light-emitting region $W_1$ has 7.25 microns in width and 53.25 microns in length, a distance between two adjacent light-emitting regions $W_1$ in the same column is 26 microns, a distance between two adjacent light-emitting regions $W_1$ in the same row is 20 microns, and a vertical distance H between the bottom surface 153b of the light absorbing layer 150a adjacent to the display element layer 120 and the top surface 126b of the light-emitting layer 126 in the light-emitting region $W_1$ is 12 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±19.5°. In the present embodiment, the horizontal distance $L_{D1}$ between the first side edge 153a of the opening 152a of the light absorbing layer 150a and the second side edge 126a of the light-emitting region $W_1$ adjacent to the first side edge 153a is 7 microns, e.g. the light absorbing layer 150a is shrunk with respect to the light-emitting layer 126 by 7 microns, such that the light-emitting angle of the light-emitting layer 126 (or the pixel structure) is around ±32.6°. In brief, the design of the present embodiment helps to maintain the light-emitting angle of the light-emitting regions $W_1$ while controlling the reflection of the ambient light.

Experimental Example V: In the example, an area of the light-emitting region $W_1$ has 20 microns in width and 30 microns in length, a distance between two adjacent light-emitting regions $W_1$ in the same column is 30 microns, a distance between two adjacent light-emitting regions $W_1$ in the same row is 20 microns, and a vertical distance H between the bottom surface 153b of the light absorbing layer 150a adjacent to the display element layer 120 and the top surface 126b of the light-emitting layer 126 in the light-emitting region $W_1$ is 7 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±30.0°. In the present embodiment, the horizontal distance $L_{D1}$ between the first side edge 153a of the opening 152a of the light absorbing layer 150a and the second side edge 126a of the light-emitting region $W_1$ adjacent to the first side edge 153a is 4 microns, e.g. the light absorbing layer 150a is shrunk with respect to the light-emitting layer 126 by 4 microns, such that the light-emitting angle of the light-emitting layer 126 (or the pixel structure) is around ±33.0°. In brief, the design of the present embodiment helps to maintain the light-emitting angle of the light-emitting regions $W_1$ while controlling the reflection of the ambient light.

Experimental Example VI: In the example, an area of the light-emitting region $W_1$ has 30 microns in width and 20 microns in length, a distance between two adjacent light-emitting regions $W_1$ in the same column is 30 microns, a distance between two adjacent light-emitting regions $W_1$ in the same row is 20 microns, and a vertical distance H between the bottom surface 153b of the light absorbing layer 150a adjacent to the display element layer 120 and the top surface 126b of the light-emitting layer 126 in the light-emitting region $W_1$ is 12 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±27.9°. In the present embodiment, the horizontal distance $L_{D1}$ between the first side edge 153a of the opening 152a of the light absorbing layer 150a and the second side edge 126a of the light-emitting region $W_1$ adjacent to the first side edge 153a is 5 microns, e.g. the light absorbing layer 150a is shrunk with respect to the light-emitting layer 126 by 5 microns, such that the light-emitting angle of the light-emitting layer 126 (or the pixel structure) is around ±32.5°. In brief, the design of the present embodiment helps to maintain the light-emitting angle of the light-emitting regions $W_1$ while controlling the reflection of the ambient light.

According to the above experimental examples, the vertical distance H between the bottom surface 153b of the light absorbing layer 150b adjacent to the display element layer 120 and the top surface 126b of the light-emitting layer 126 in the light-emitting region $W_1$ may be related on the shrinking distance of the light absorbing layer 150a, e.g. the horizontal distance $L_{D1}$ between the first side edge 153a of the opening 152a of the light absorbing layer 150a and the second side edge 126a of the light-emitting region $W_1$ adjacent to the first side edge 153a. In addition, the width $W_{D1}$ of the light-emitting region $W_1$ may be related on the shrinking distance of the light absorbing layer 150a and the light-emitting angle of the light-emitting layer 126. In brief, in an example where a light-emitting angle of the light-emitting region $W_1$ without the light absorbing layer is more than 95%, the shrinking distance of the light absorbing layer 150a may satisfy $0 < L_{D1} \leq 2\sqrt{H}$.

In the design of the display device 100a according to the disclosure, the area of the pixel structure P1 is P, the area of the light-emitting region $W_1$ is W, and the area of the opening 152a is AR, which satisfies W<AR≤0.5P, such that the light absorbing layer 150a may efficiently block the reflection of the ambient light without obstructing the predetermined light-emitting angle of the light-emitting region $W_1$. Furthermore, the reflection of the ambient light may be effectively reduced by the design of controlling the transmittance rate of the ambient light via the gray film 140a. In other words, the dispositions of the gray film 140a and the light absorbing layer 150a are helpful to enhance the ambient contrast ratio of the display device 100a relative to the ambient brightness. Under the design of W<AR≤0.5P, the display device 100a according to an embodiment of the disclosure may maintain the light-emitting angle of the light-emitting region $W_1$ and enhance the ambient contrast ratio of the display device 100a relative to the ambient brightness while the reflection of the ambient light is controlled.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 3:
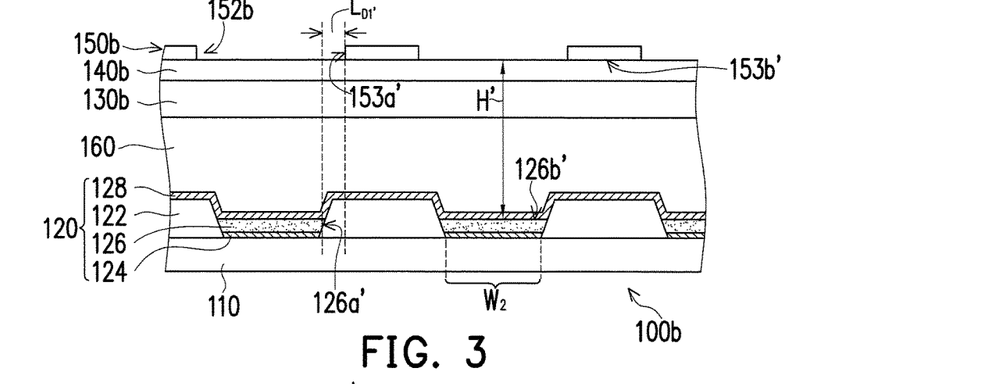
FIG. 3 is a schematic cross-sectional view of a display device according to another embodiment of the disclosure.

FIG. 3 is a schematic cross-sectional view of a display device according to another embodiment of the disclosure. Referring FIG. 3 and FIG. 1A simultaneously, the display device 100b is similar to the display device 100a of FIG. 1A, the second substrate 130b of the display device 100b is located between the light absorbing layer 150b and the first substrate 110, and a vertical distance H' between a bottom surface 153b' of the light absorbing layer 150b adjacent to the display element layer 120 and the top surface 126b' of the light-emitting layer 126 in the light-emitting region $W_2$ is larger than a vertical distance H between the bottom surface 153b of the light absorbing layer 150a adjacent to the display element layer 120 and the top surface 126b of the light-emitting layer 126 in the light-emitting region $W_1$ shown in FIG. 1A.

The following experimental examples illustrate that the display device 100b may maintain the light-emitting angle of the light-emitting regions $W_2$ while controlling the reflection of the ambient light. In a known display device without the configuration of the light absorbing layer, the light-emitting angle of the light-emitting layer is around ±33.3°.

Experimental Example VII: In the example, an area of the light-emitting region $W_2$ has 15.75 microns in width and 49.5 microns in length, a distance between two adjacent light-emitting regions $W_2$ in the same column is 32 microns, a distance between two adjacent light-emitting regions $W_2$ in the same row is 25 microns, and a vertical distance H' between the bottom surface 153b' of the light absorbing layer 150b adjacent to the display element layer 120 and the top surface 126b' of the light-emitting layer 126 in the light-emitting region $W_2$ is 20 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±22.9°. In the present embodiment, the horizontal distance $L_{D1'}$ between the first side edge 153a' of the opening 152b of the light absorbing layer 150b and the second side edge 126a' of the light-emitting region $W_2$ adjacent to the first side edge 153a' is 8 microns, e.g. the light absorbing layer 150b is shrunk with respect to the light-emitting layer 126 by 8 microns, such that the light-emitting angle of the light-emitting layer 126 (or the pixel structure) is around ±33.0°. In brief, the design of the present embodiment helps to maintain the light-emitting angle of the light-emitting regions $W_2$ while controlling the reflection of the ambient light.

Experimental Example VIII: In the example, an area of the light-emitting region $W_2$ has 7.25 microns in width and 53.25 microns in length, a distance between two adjacent light-emitting regions $W_2$ in the same column is 26 microns, a distance between two adjacent light-emitting regions $W_2$ in the same row is 20 microns, and a vertical distance H' between the bottom surface 153b' of the light absorbing layer 150b adjacent to the display element layer 120 and the top surface 126b' of the light-emitting layer 126 in the light-emitting region $W_2$ is 20 microns. The known display device is configured with the light absorbing layer, while the outline of the orthogonal projection of the light absorbing layer onto the substrate configured with the light-emitting layer is aligned with the outline of the orthogonal projection of the light-emitting layer, such that the light-emitting angle of the light-emitting layer is around ±14.2°. In the present embodiment, the horizontal distance $L_{D1'}$ between the first side edge 153a' of the opening 152b of the light absorbing layer 150b and the second side edge 126a' of the light-emitting region $W_2$ adjacent to the first side edge 153a' is 9 microns, e.g. the light absorbing layer 150b is shrunk with respect to the light-emitting layer 126 by 9 microns, such that the light-emitting angle of the light-emitting layer 126 (or the pixel structure) is around ±33.1°. In brief, the design of the present embodiment helps to maintain the light-emitting angle of the light-emitting regions $W_2$ while controlling the reflection of the ambient light.

Figure 4:
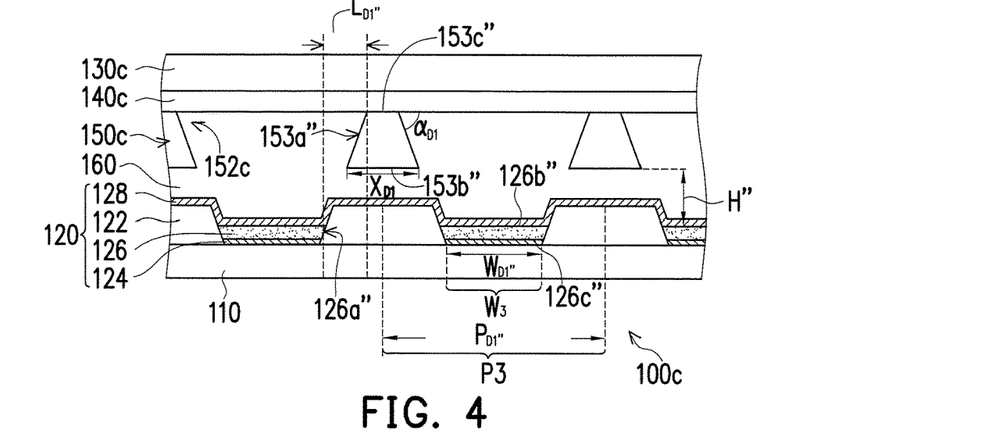
FIG. 4 is a schematic cross-sectional view of a display device according to further another embodiment of the disclosure.

FIG. 4 is a schematic cross-sectional view of a display device according to another embodiment of the disclosure. Referring to FIG. 4 and FIG. 1A, the display device 100c of the present embodiment is similar to the display device 100a of FIG. 1A. A width of the light absorbing layer 150c is gradually reduced from a bottom surface 153b'' adjacent to the display element layer 120 toward a upper surface 153c'' away from the display element layer 120, and an edge of the upper surface 153c'' surrounds and defines the opening 152c. The cross sectional shape of the opening 152c of the light absorbing layer 150c may, for example, be a reversed trapezoid.

In the present embodiment, the light-emitting angle of the light-emitting region $W_3$ may be maintained while the reflection of the ambient light is controlled. A width of the pixel structure P3 is $P_{D1'''}$, a width of the light-emitting region $W_3$ is $W_{D1'''}$, a vertical, distance between the bottom surface 153b'' of the light absorbing layer 150c adjacent to the display element layer 120 and a top surface 126b'' of the light-emitting layer 126 in the light-emitting region $W_3$ is H'', an angle between a first side surface 153a'' of the light absorbing layer 150c and the gray film 140c is $\alpha_{D1}$, a horizontal distance between a first side edge 153a'' of the opening 152c of the light absorbing layer 150c and a second side edge 126a'' of the light-emitting region $W_3$ adjacent to the first side edge 153a'' is $L_{D1'''}$, and a width of the bottom surface 153b'' of the light absorbing layer 150c is $X_{D1}$, such that $P_{D1'''}-W_{D1'''}-2H''\times\tan(90°-\alpha_{D1})\geq X_{D1}\geq P_{D1'''}-W_{D1'''}-2L_{D1'''}$, wherein $\alpha_{D1}\leq 90°$.

Figure 5:
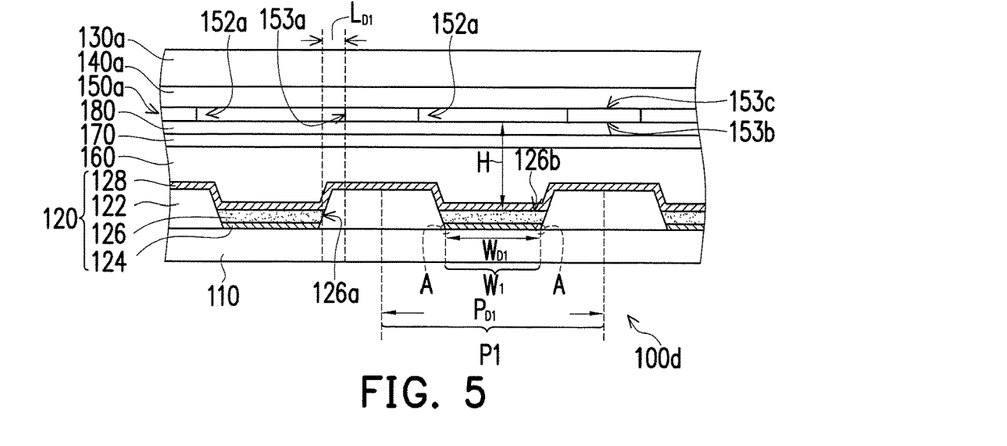
FIG. 5 is a schematic cross-sectional view of a display device according to still another embodiment of the disclosure.

FIG. 5 is a schematic cross-sectional view of a display device according to still another embodiment of the disclosure. Referring to FIG. 5 and FIG. 1A, the display device 100d of the present embodiment is similar to the display device 100a of FIG. 1A. The display device 100d further includes a touch element layer 170, wherein the touch element layer 170 is disposed on the second substrate 130a and located between the display element layer 120 and the light absorbing layer 150a to serve the touch sensing function. For the display device 100d to have a better flatness, the display device 100d may further include a planarization layer 180 disposed on the second substrate 130a to cover the light absorbing layer 150a and the touch element layer 170 may be disposed on the planarization layer 180.

In the design of the display device according to an embodiment of the disclosure, the area of the pixel structure is P, the area of the light-emitting region is W, and the area of the opening is AR, which satisfy W<AR≤0.5P, the light absorbing layer may efficiently block the reflection of the ambient light without obstructing the predetermined light-emitting angle of the light-emitting region. Furthermore, the reflection of the ambient light may be effectively reduced by the design of controlling the transmittance rate of the ambient light via the gray film. In other words, the dispositions of the gray film and the light absorbing layer may enhance the ambient contrast ratio of the display device relative to the ambient brightness. Briefly, under the design of W<AR≤0.5P, the display device according to an embodiment of the disclosure may maintain the light-emitting angle of the light-emitting region and enhance the brightness ratio of the display device relative to the ambient brightness while the reflection of the ambient light is controlled.

It will be clear that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A display device, comprising:
   a first substrate;
   a display element layer disposed on the first substrate and comprising at least one pixel structure, wherein the pixel structure comprises a light-emitting layer and has a light-emitting region;
   a second substrate opposite to the first substrate;
   a gray film disposed on the second substrate; and
   a light absorbing layer disposed on the second substrate, the light absorbing layer having at least one opening, and an orthogonal projection area of the gray film on the second substrate overlapping with an orthogonal protection area of the opening on the second substrate, wherein an area of the pixel structure is P, an area of the light-emitting region is W, an area of the opening is AR, and W<AR≤0.5P, and an orthogonal projection area of the light-emitting region on the second substrate is located in the orthogonal projection area of the opening on the second substrate.

2. The display device of claim 1, wherein a horizontal distance between a first side edge of the opening of the light absorbing layer and a second edge of the light-emitting region adjacent to the first side edge is $L_{D1}$, a vertical distance between a bottom surface of the light absorbing layer adjacent to the display element layer and a top surface of the light-emitting layer in the light-emitting region is H, and $0<L_{D1}\leq 2\sqrt{H}$.

3. The display device of claim 1, wherein a width of the light absorbing layer is gradually reduced from a bottom surface adjacent to the display element layer toward an upper surface away from the display element layer, and an edge of the upper surface surrounds and defines the opening.

4. The display device of claim 3, wherein a width of the pixel structure is $P_{D1}$, a width of the light-emitting region is $WD_{D1}$, a vertical distance between the bottom surface of the light absorbing layer adjacent to the display element layer and a top surface of the light-emitting layer in the light-emitting region is H, an angle between a side surface of the light absorbing layer and the gray film is $\alpha_{D1}$, a horizontal distance between a first side edge of the opening of the light absorbing layer and a second side edge of the light-emitting region adjacent to the first side edge is $L_{D1}$, a width of the bottom surface of the light absorbing layer is $X_{D1}$, and $P_{D1}-W_{D1}-2H\times\tan(90°-\alpha_{D1})\geq X_{D1}\geq P_{D1}-W_{D1}-2L_{D1}$, wherein $\alpha_{D1}\leq 90°$.

5. The display device of claim 1, wherein the pixel structure further comprises a pixel defining layer, a first electrode, and a second electrode, wherein
   the pixel defining layer has at least one pixel disposing opening,
   the first electrode, the light-emitting layer and the second electrode sequentially stack over the first substrate in the pixel disposing opening, and
   the second electrode further extends to cover the pixel defining layer.

6. The display device of claim 5, wherein an outline of the pixel disposing opening adjacent to the first substrate surrounds and defines the light-emitting region.

7. The display device of claim 5, wherein a transversal area of the pixel disposing opening is gradually increased from the first substrate toward the second substrate.

8. The display device of claim 5, wherein a width of the light absorbing layer is less than a width of the pixel defining layer.

9. The display device of claim 1, wherein the light absorbing layer extends in an equal width from a bottom surface adjacent to the display element layer in a direction away from the display element layer.

10. The display device of claim 1, wherein the gray film and the light absorbing layer are located between the second substrate and the first substrate.

11. The display device of claim 1, wherein the second substrate is located between the light absorbing layer and the first substrate.

12. The display device of claim 1, further comprising:
a medium layer, disposed between the display element layer and the second substrate.

13. The display device of claim 1, wherein a material of the light absorbing layer comprises a black resin material.

14. The display device of claim 1, wherein the opening of the light absorbing layer exposes a portion of the gray film.

15. The display device of claim 1, further comprising:
a touch element layer disposed on the second substrate.

16. The display device of claim 15, further comprising:
a planarization layer disposed on the second substrate to cover the light absorbing layer, and the touch element layer is disposed on the planarization layer.

17. The display device of claim 1, wherein a first length difference in a first direction and a second length difference in a second direction are formed between the orthogonal projection area of the opening on the second substrate and the orthogonal projection area of the light-emitting region on the second substrate, the first direction is different from the second direction, and the first length difference is different from the second length difference.

18. The display device of claim 1, wherein the gray film has a transmittance rate of 20% to 70% for a wavelength of 550 nm.

19. The display device of claim 1, wherein the light absorbing layer has a transmittance rate less than 10% for a wavelength of 550 nm.

20. The display device of claim 1, wherein a ratio of optical density of the light absorbing layer and the gray film for a visible light is 1 to 40.

* * * * *